(12) United States Patent
Yoon et al.

(10) Patent No.: US 7,510,914 B2
(45) Date of Patent: Mar. 31, 2009

(54) SEMICONDUCTOR DEVICES HAVING FUSES AND METHODS OF FORMING THE SAME

(75) Inventors: Hyun-Chul Yoon, Yongin-si (KR); Jong-Kyu Kim, Seoul (KR); Jang-Bin Yim, Yongin-si (KR); Sang-Dong Kwon, Suwon-si (KR); Sung-Gil Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 150 days.

(21) Appl. No.: 11/447,944

(22) Filed: Jun. 7, 2006

(65) Prior Publication Data

US 2006/0289899 A1    Dec. 28, 2006

(30) Foreign Application Priority Data

Jun. 22, 2005   (KR) .................. 10-2005-0053768

(51) Int. Cl.
    *H01L 21/82*    (2006.01)
(52) U.S. Cl. ............... 438/132; 438/601; 257/E21.592; 257/E23.149
(58) Field of Classification Search .......... 438/132, 438/601, 736
    See application file for complete search history.

(56) References Cited

U.S. PATENT DOCUMENTS 5,817,572 A * 10/1998 Chiang et al. ............... 438/624
6,037,648 A    3/2000 Arndt et al.
6,096,659 A * 8/2000 Gardner et al. .............. 438/736
6,320,243 B1 * 11/2001 Jeong et al. ................. 257/529
2004/0266155 A1 * 12/2004 Ang et al. .................... 438/595
2005/0161766 A1 * 7/2005 Sato et al. .................... 257/529

FOREIGN PATENT DOCUMENTS

JP         2004-186304        7/2004
KR       10-0340714           6/2002

\* cited by examiner

*Primary Examiner*—George Fourson
*Assistant Examiner*—Julio J. Maldonado
(74) *Attorney, Agent, or Firm*—Harness, Dickey & Pierce, P.L.C.

(57) ABSTRACT

Semiconductor devices having a plurality of fuses and methods of forming the same are provided. The semiconductor device having a fuse including a substrate having a cell region and/or a fuse box region. A first insulation interlayer may be formed on the substrate. A first etch stop layer may be formed on the first insulation interlayer. A metal wiring including a barrier layer, a metal layer and/or a capping layer may be formed on the first etch stop layer of the cell region. Fuses, spaced apart from each other, may be formed on the first etch stop layer of the fuse box region. Each fuse may include the barrier layer and/or the metal layer. A second insulation interlayer having an opening exposing the fuse box region may be formed on the metal wiring and/or the first etch stop layer. The etch stop layer may allow the fuses to be formed more uniformly and decrease the probability of breaking the fuses.

10 Claims, 9 Drawing Sheets

SEMICONDUCTOR DEVICES HAVING FUSES AND METHODS OF FORMING THE SAME

PRIORITY STATEMENT

This application claims priority upon 35 USC § 119 to Korean Patent Application No. 2005-0053768, filed Jun. 22, 2005 in the Korean Intellectual Property Office, the contents of which are herein incorporated by reference in its entirety.

BACKGROUND OF THE INVENTION

1. Field of the Invention

Example embodiments of the present invention relate to semiconductor devices and methods of manufacturing the same. Other example embodiments of the present invention relate to semiconductor devices having more uniformly formed fuses, and methods of manufacturing the same.

2. Description of the Related Art

Semiconductor devices may be manufactured through four basic processes: a fabrication (hereinafter referred to as "FAB") process, an electrical die sorting (hereinafter referred to as "EDS") process, an assembly process and/or a test process.

During the manufacture of integrated circuits (ics) on a wafer, it may be necessary to perform several processes, including repetitively performing some of the processes. Examples of wafer processes may include diffusion, lithography, etching and/or deposition. The formation of a wafer layer, which may be capable of electrically operating, as part of a work-in-progress product is called a fab process. The finished integrated circuit is called a chip or a die.

After completing a lithography process, an EDS process may be carried on a passivation layer. The EDS process may be the last step of the FAB process. The EDS process may test the electrical properties of each of the chips constituting the wafer and/or sort out defective chips.

The EDS process may include a pre-laser test, a laser-repair process, a post-laser test and/or a back-grinding process. The pre-laser test may identify the defective chips and/or generate the sorting data. The laser-repair process may repair the identified defective chips based on the data generated from the pre-laser test. The post-laser test may re-test the repaired chips to determine if the repairing process was successful. The back-grinding process may grind down the back of the wafer by using a diamond wheel or similar instrument.

The laser-repair process may include cutting a wiring connected to a defective memory cell by irradiating a laser beam onto the wiring and/or replacing the defective memory cell with a redundancy cell built into the chip. The wiring, to be cut by the laser beam, is typically called a fuse. The fuse may be a means for electrically removing the defective memory cell when a defect is detected in a bit of the memory cell. The fuse may drive the redundancy cell that may be formed during manufacturing of the chips.

Repair may be conducted in a fuse box region of the chip. A polysilicon layer serving as a word line may be used as the fuse. In Merged DRAM and Logic (MDL) devices, the DRAM device and/or logic device may be on a single wafer to increase circuit speed and/or to reduce manufacturing costs. In MDL devices, a portion of a metal line may be used as the fuse if multilevel interconnect schemes are necessary.

FIGS. 1A to 1C are cross-sectional views illustrating a method of forming a fuse of a semiconductor device in accordance with a conventional method.

Referring to FIG. 1A, transistors (not shown) including gate electrodes, serving as word lines and/or source/drain regions, may be formed on a semiconductor substrate 10 having a memory cell region and/or a fuse box region. After forming an insulating layer (not shown) over the transistors and/or the substrate 10, a bit line 14 may be formed on the insulating layer. The bit line 14 may be electrically connected with the drain region of the transistor.

Silicon oxide may be deposited on the bit line 14 to form a first insulation interlayer 16. The first insulation interlayer 16 may be etched by a lithography process to form a contact hole 18 that may expose a portion of the bit line 14.

A conductive layer may be deposited over the contact hole 18 and/or the first insulation interlayer 16. The conductive layer may be planarized to the upper surface of the first insulation interlayer 16 to form a contact plug 20 filling up the contact hole 18. The contact plug 20 may be formed using a metal such as tungsten (W).

A first barrier layer 22, a first metal layer 24 and/or a first capping layer 26 may be deposited on the contact plug 20 and/or the first insulation interlayer 16. The first barrier layer 22 may be formed of titanium/titanium nitride (Ti/TiN). The first metal layer 24 may be formed of aluminum (Al). The first capping layer 26 may be formed of titanium/titanium nitride (Ti/TiN). The first barrier layer 22, the first metal layer 24 and/or the first capping layer may be patterned by a lithography process to form a first metal wiring 28a and/or a plurality of fuses 28b. The first metal wiring 28a may be electrically connected to the underlying bit line 14 through the contact plug 20.

Silicon oxide may be deposited on the first metal wirings 28a and/or the first insulation interlayer 16 with the fuses 28b to form a second insulation interlayer 30. The second insulation interlayer 30 may be etched by a photolithography process to form a via hole 32 that may expose a portion of the first metal wiring 28a.

A second barrier layer 34, a second metal layer 36 and/or a second capping layer 38 may be deposited on the via hole 32 and/or the second insulation interlayer 30. The second barrier layer 34 may be formed of Ti/TiN. The second metal layer 36 may be formed of aluminum (Al). The second capping layer 38 may be formed of Ti/TiN. The second barrier layer 34, the second metal layer 36 and/or the second capping layer may be patterned by a lithography process to form a second metal wiring 40 to be electrically connected with the first metal wiring 28a through the via hole 32.

Silicon oxide may be deposited on the second metal wiring 40 and/or the second insulation interlayer 30 to form a third insulation interlayer 42. Silicon nitride may be deposited on the third insulation interlayer 42 to form a fourth insulation interlayer 44.

After coating a photoresist on the fourth insulation interlayer 44, the photoresist may be exposed and/or developed to form photoresist patterns 46 for defining the fuse box region.

Referring to FIG. 1B and FIG. 1C, using the photoresist patterns 46 as an etching mask, the fourth insulation interlayer 44, the third insulation interlayer 42 and/or the second insulation interlayer 30 may be etched to form an opening 48 that exposes the fuse box region.

The fuses 28b may be etched until the first metal layer 24 of the fuse 28b, which may be exposed by the opening 48, has a thickness of about 2,000 Å.

When performing the etching process of opening the fuse box region, it may be difficult to accurately etch the third insulation interlayer 42 and/or second insulation interlayer

30, which may be formed of silicon oxide, to a depth of about 25,000 Å at the etch rate of about 10,000 Å/min, without using an etch stop layer.

As shown in FIG. 1B, if the insulation interlayers 42 and 30 are not sufficiently etched, then the fuse 28b may be under-exposed. As a result, when cutting a fuse connected to a defective memory cell in a laser-repair step, over-cutting using a higher-energy laser beam may be necessary in order to remove the insulating layer on the fuse. An adjacent fuse (e.g., a fuse connected to a normal memory cell) may be damaged.

As shown in FIG. 1C, if the insulation interlayers 42 and 30 are over-etched in order to sufficiently expose the fuse 28b, the fuse 28b may break due to the removal of the first metal layer 24.

SUMMARY OF THE INVENTION

Example embodiments of the present invention provide semiconductor devices and methods of forming the same. Example embodiments of the present invention provide semiconductor devices having a plurality of fuses and methods of forming the same.

Other example embodiments of the present invention provide semiconductor devices having more uniformed fuses. Example embodiments of the present invention provide a method of manufacturing a semiconductor device that may more uniformly form fuses and reduce the probability of breaking the fuses.

In example embodiments of the present invention, there are provided semiconductor devices which may include a semiconductor substrate having a memory cell region, a fuse box region, a first insulation interlayer formed on the semiconductor substrate and/or a first etch stop layer formed on the first insulation interlayer. A metal wiring including a barrier layer, a metal layer and/or a capping layer, which may be successively stacked, may be formed on the first etch stop layer of the memory cell region. A plurality of fuses, spaced apart from each other, may be formed on the first etch stop layer of the fuse box region. Each of the fuses may include the barrier layer and/or the metal layer. A second insulation interlayer, having an opening that may expose the fuse box region, may be formed on the metal wiring and the first etch stop layer.

In other example embodiments of the present invention, the first etch stop layer may be formed from a material that has an etch selectivity with respect to the second insulation interlayer.

In example embodiments of the present invention, the semiconductor device may further include a passivation layer that may be continuously formed on the second insulation interlayer, the first etch stop layer and/or the plurality of fuses. The passivation layer may be formed to reduce damage to adjacent fuses and/or may be formed of silicon nitride.

According to example embodiments of the present invention, the second insulation interlayer may include yet another insulation interlayer formed on an upper metal wiring to be electrically connected with the metal wiring.

In example embodiments of the present invention, the metal wiring may further include a second etch stop layer formed on the capping layer. The second etch stop layer may be formed of silicon germanium (SiGe).

According to other example embodiments of the present invention, a semiconductor device including a semiconductor substrate having a memory cell region and/or a fuse box region is provided. A first insulation interlayer may be formed on the semiconductor substrate. A metal wiring including a barrier layer, a metal layer and/or a capping layer, which may be successively stacked, may be formed on the first insulation interlayer of the memory cell region. A plurality of fuses, spaced apart from each other, may be formed on the first insulation interlayer of the fuse box region. Each of the fuses may include the barrier layer and/or the metal layer. An etch stop layer may be continuously formed on the metal wiring and/or the first insulation interlayer of the memory cell region. Spacers for etch stopping may be formed on both sidewalls of each of the fuses. The spacers may be formed from the same layer, or material, as the etch stop layer. A second insulation interlayer, having an opening that exposes the fuse box region, may be formed on the metal wiring and the first etch stop layer.

In example embodiments of the present invention, a method of manufacturing a semiconductor device is provided. A first insulation interlayer may be formed on a semiconductor substrate having a memory cell region and/or a fuse box region. A first etch stop layer may be formed on the first insulation interlayer. A barrier layer, a metal layer and/or a capping layer may be successively stacked on the first etch stop layer. The stacked layers may be patterned to form a metal wiring on the first etch stop layer of the memory cell region and/or to form a plurality of fuses on the first etch stop layer of the fuse box region. The fuses may be spaced apart from each other. A second insulation interlayer may be formed on the metal wiring, a plurality of fuses and/or the first etch stop layer. The second insulation interlayer may be etched to form an opening exposing the fuse box region. A plurality of fuses, exposed by the opening, may be etched to a portion of the metal layer.

In example embodiments of the present invention, the first etch stop layer may be formed of silicon nitride.

In other example embodiments of the present invention, a second etch stop layer may be formed on the capping layer before the stacked layers are patterned. The second etch stop layer may be formed of silicon germanium (SiGe).

After etching the plurality of fuses to expose a portion of the metal layer, a passivation layer may be continuously formed on the second insulation interlayer, the first etch stop layer and/or a plurality of fuses in order to reduce damage to adjacent fuses.

In other example embodiments of the present invention, a method of manufacturing a semiconductor device is provided. A first insulation interlayer may be formed on a semiconductor substrate having a memory cell region and/or a fuse box region. A barrier layer, a metal layer and/or a capping layer may be successively stacked on the first insulation interlayer. The stacked layers may be patterned to form a metal wiring on the first insulation interlayer of the memory cell region and/or to form a plurality of fuses on the first insulation interlayer of the fuse box region. The fuses may be spaced apart from each other. An etch stop layer may be continuously formed on the first insulation interlayer, the metal wiring and/or a plurality of fuses. A second insulation interlayer may be formed on the metal wiring, a plurality of fuses and/or the etch stop layer. The second insulation interlayer may be etched to form an opening that exposes the fuse box region. A plurality of fuses exposed by the opening may be etched to a portion of the metal layer. Spacers may be formed on both sidewalls of each of the fuses. The spacers may be formed of the same layer as the etch stop layer.

In example embodiments of the present invention, if the etch rate of the fuses is similar to the etch rate of the etch stop layer, then fuses may be simultaneously etched with the formation of the fuses.

According to example embodiments of the present invention, the process of etching the insulation interlayers to open the fuse box region may be performed on a semiconductor device with a fuse, if the fuse has an etch selectivity with respect to the second insulation interlayer.

Accordingly, the insulation interlayers may be more uniformly etched to the etch stop layer such that the fuses may be formed more uniformly. Although the insulation interlayer may be over-etched to keep the fuses from being under-exposed, the etching process may be stopped on the etch stop layer to reduce the chances of breaking the fuses.

BRIEF DESCRIPTION OF THE DRAWINGS

Example embodiments of the present invention will become readily apparent by reference to the following detailed description when considering in conjunction with the accompanying drawings. FIGS. 1-5 represent non-limiting example embodiments of the present invention as described herein.

FIG. 2 is a cross-sectional view illustrating a semiconductor device in accordance with example embodiments of the present invention;

FIG. 4 is a cross-sectional view illustrating a semiconductor device in accordance with example embodiments of the present invention.

DESCRIPTION OF EXAMPLE EMBODIMENTS

Figure 1A:
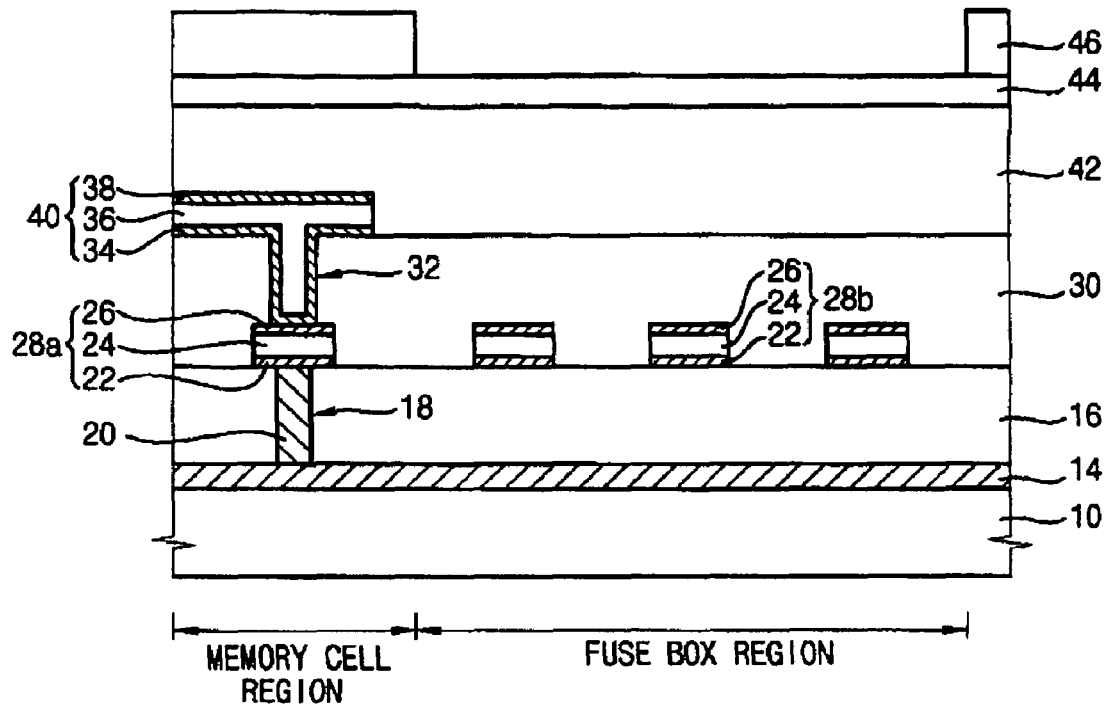
FIGS. 1A to 1C are cross-sectional views illustrating a method of forming a fuse of a semiconductor device in accordance with a conventional method.
Figure 1B:
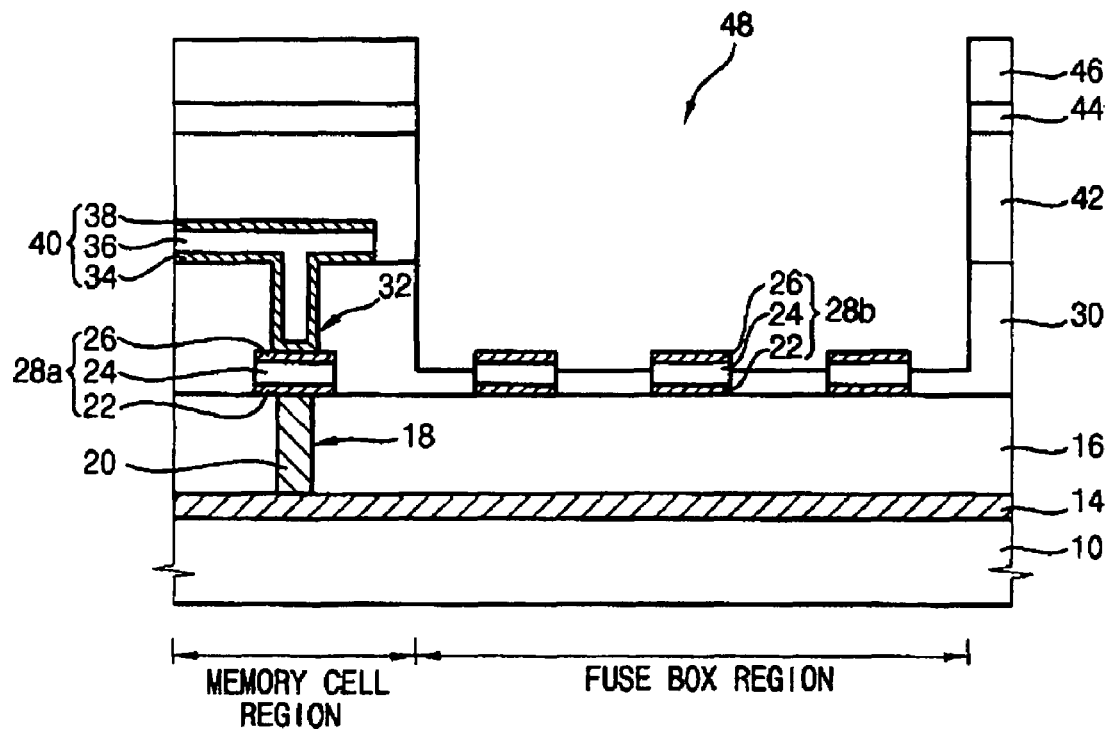
Figure 1C:
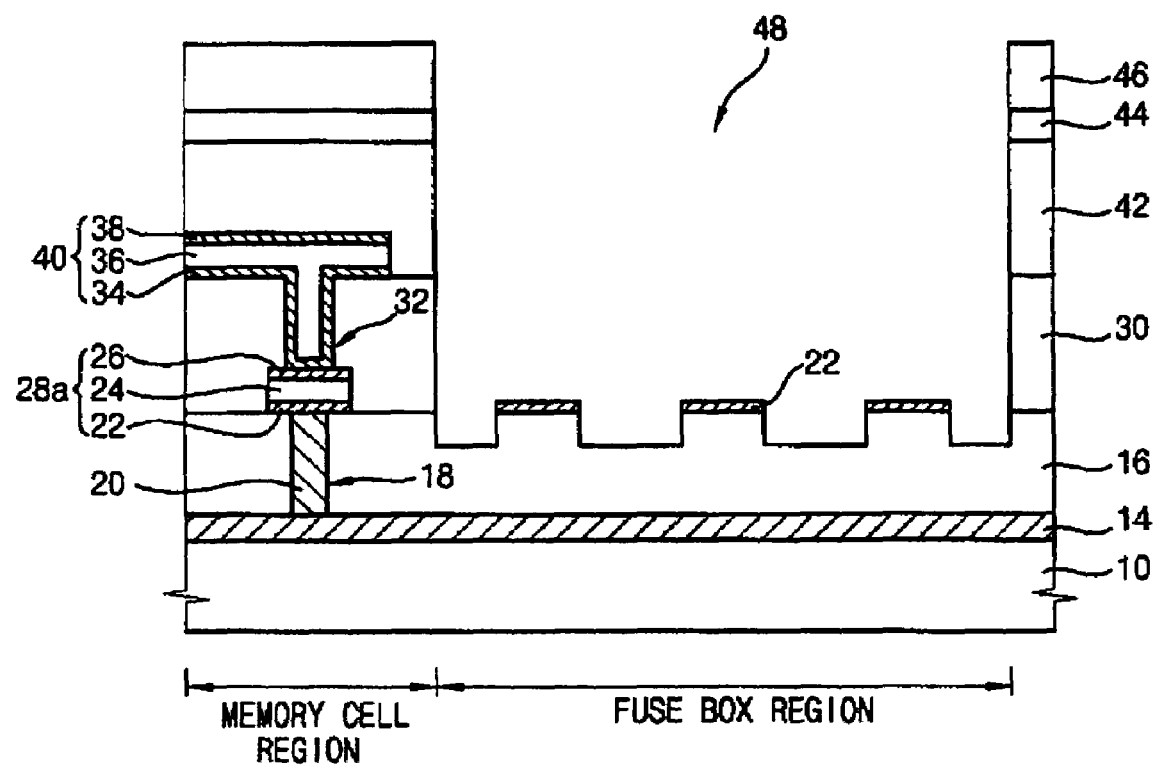

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

In the example embodiments of the present invention, like reference numeral denote like elements.

Example embodiments of the present invention provide semiconductor devices and methods of forming the same. Example embodiments of the present invention provide semiconductor devices having a plurality of fuses and methods of forming the same.

Other example embodiments of the present invention provide semiconductor devices, which may be capable of more uniformly forming fuses and reducing the possibility of breaking the fuses.

Figure 2:
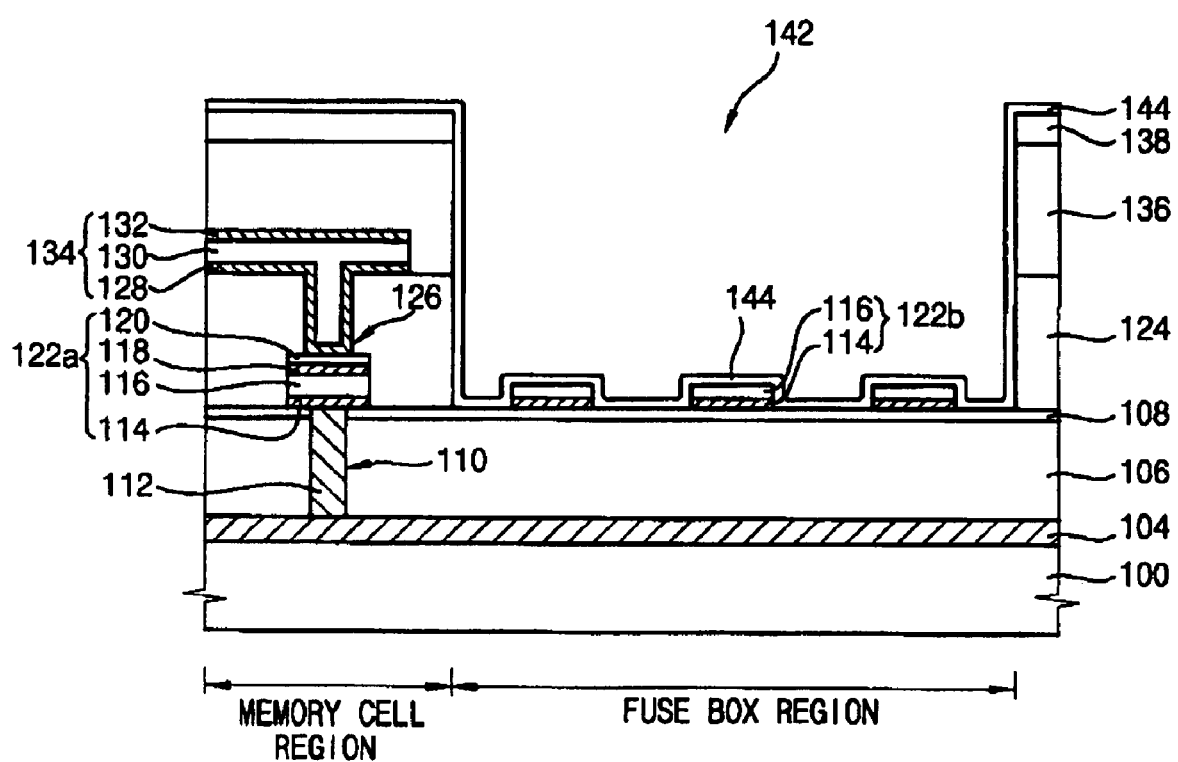

FIG. 2 is a cross-sectional view illustrating a semiconductor device in accordance with example embodiments of the present invention.

Referring to FIG. 2, transistors (not shown) including gate electrodes serving as word lines and source/drain regions may be formed on a semiconductor substrate 100 having a memory cell region and/or a fuse box region.

An insulating layer (not shown) may be formed on the substrate 100 to substantially cover the transistors. A bit line 104 may be formed on the insulating layer and electrically connected with the drain region of the transistor.

A first insulation interlayer 106 may be formed over the bit line 104. According to an example embodiment, the first insulation interlayer 106 may be formed of silicon oxide. The first insulation layer 106 may be formed of several layers. A first etch stop layer 108 may be formed on the first insulation interlayer 106. The first etch stop layer 108 may be formed of a material having an etch selectivity with respect to silicon oxide. According to another example embodiment, the first etch stop layer 108 may be formed of silicon nitride.

When the first insulation interlayer 106 may be formed of silicon oxide is etched so as to open the fuse box region, the first etch stop layer 108 may function as an etch stopper to make the etching of the first insulation interlayer 106 uniform.

The first insulation interlayer 106 and/or first etch stop layer 108 may have a contact hole 110 that exposes a portion of the bit line 104. A contact plug 112 may be formed in the contact hole 110. The contact plug 112 may be formed using a conductive material such as tungsten (W).

A first metal wiring 122a may be formed on the first etch stop layer 108 of the memory cell region. The first metal wiring 122a may include a first barrier layer 114, a first metal layer 116, a first capping layer 118 and/or a second etch stop layer 120, which may be successively stacked.

Spaced apart from each other, a plurality of fuses 122b may be formed on the first etch stop layer 108 of the fuse box region. Each of the fuses 122b may include the first barrier layer 114 and/or the first metal layer 116.

The first barrier layer 114 may prevent the first metal layer 116, which may be formed of aluminum (Al), from reacting with the contact plug 112, which may be formed of tungsten (W), to form undesirable by-products. Further, the first barrier layer 114 may increase adhesion of the first metal layer 116 to the underlying first insulation interlayer 106, which may be formed using silicon oxide. The first barrier layer 114 may be formed using titanium/titanium nitride (Ti/TiN).

The first capping layer 118 may retard oxidation of the first metal layer 116 and/or may protect the first metal layer 116. The first capping layer 118 may be formed using titanium/titanium nitride (Ti/TiN).

The second etch stop layer 120 may be used as an etch stopper during an etching process of opening the fuse box region, decreasing the susceptibility of the first metal layer 116 for the fuses 122b to attack. When etching the fuses 122b, the first metal layer 116 may be more uniformly etched by the second etch stop layer 120. The second etch stop layer 120 may be formed of silicon-germanium (SiGe)

A second insulation interlayer 124, having an opening 142 that exposes the fuse box region, may be formed on the first metal wiring 122a and/or the first etch stop layer 108. The second insulation interlayer 124 may be formed of silicon oxide.

A second metal wiring 134 may be formed on the second insulation interlayer 124, may be formed on the first metal wiring 122a and/or the first etch stop layer 108. The second metal wiring 134 may be electrically connected with the first metal wiring 122a through a via hole 126, which may pass through the second insulation interlayer 124 to expose a portion of the underlying first metal wiring 122a.

The second metal wiring 134 may be formed by successively stacking a second barrier layer 128, a second metal layer 130 and/or a second capping layer 132. The second barrier layer 128 may be formed of Ti/TiN. The second metal layer 130 may be formed of aluminum. The second capping layer 132 may be formed of Ti/TiN.

A third insulation interlayer 136 and a fourth insulation layer 138 may be successively formed on the second metal wiring 134 and/or the second insulation interlayer 124. The third insulation interlayer 136 and/or the insulation interlayer 138 may have an opening 142, which may expose the fuse box region. The third insulation interlayer 136 may be formed of silicon oxide. The fourth insulation interlayer 138 may be formed of silicon nitride. The opening 142, which may expose the fuse box region, may be formed through the fourth insulation interlayer 138, the third insulation interlayer 136 and/or the second insulation interlayer 124.

A passivation layer 144 may be continuously formed on the fourth insulation interlayer 138, the first etch stop layer 108 and/or a plurality of fuses 122b. The passivation layer 144 may be formed of silicon nitride. When cutting a fuse connected to a defective memory cell by a laser beam in a laser-repair step, the passivation layer 144 may reduce the possibility of damaging the adjacent fuses.

According to example embodiments of the present invention, the first etch stop layer 108 may function as an etch stopper during the etching of the insulation interlayers to open the fuse box region in order that the etching of the insulation interlayers may be performed more uniformly to the first etch stop layer 108. The second etch stop layer 120 may reduce the chances of the first metal layer 116 for the fuses 122b being attacked during the etching process of opening the fuse box region. Due to the second etch stop layer 120, the first metal layer 116 for the fuses 122b may be etched to a more uniform thickness during the etching process of exposing the fuses.

Accordingly, the fuses 122b may be formed more uniformly by the first etch stop layer 108 and/or the second etch stop layer 120. In addition, even though the insulation interlayers may be over-etched to ensure that the fuses 122b open, the etching process may be stopped precisely on the first etch stop layer 108 to reduce the chances of breaking the fuses 122b.

FIGS. 3A to 3F are cross-sectional views illustrating a method of manufacturing a semiconductor device shown in FIG. 2.

Figure 3A:
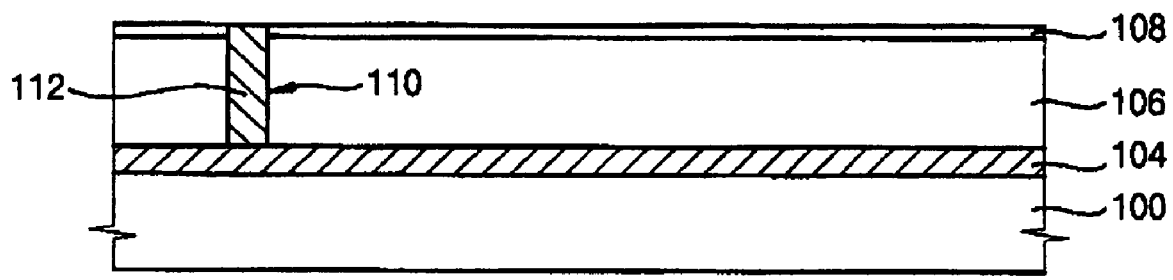
FIGS. 3A to 3F are cross-sectional views illustrating a method of forming a fuse of a semiconductor device in accordance with example embodiments of the present invention.

Referring to FIG. 3A, after forming transistors (not shown) including gate electrodes serving as word lines and/or source/drain regions on a semiconductor substrate 100 including silicon, an insulating layer (not shown) may be formed on the substrate 100 to cover the transistors. A bit line 104 may be formed on the insulating layer to electrically connect with the drain regions of the transistor.

An insulating material may be deposited on the bit line 104 to form a first insulation interlayer 106. The first insulation interlayer 106 may be formed of silicon oxide. The first insulation interlayer 106 may be formed by any suitable method known in the art, such as chemical vapor deposition (CVD), plasma-enhanced chemical vapor deposition (PECVD) or high-density plasma chemical vapor deposition (HDP-CVD).

A material having an etch selectivity with respect to the first insulation interlayer 106 may be deposited to a thickness of about 1,000 Å to about 4,000 Å on the first insulation interlayer 106, forming a first etch stop layer 108. The first etch stop layer 108 may be formed of silicon nitride. The first etch stop layer 108 may be formed by any suitable method known in the art, such as CVD, PECVD or low-pressure CVD (LPCVD). The first etch stop layer 108 may serve as an etch stopper during an etching process of opening the fuse box region.

The first etch stop layer 108 and/or the first insulation interlayer 106 may be etched by a photolithography process to form a contact hole 110 that exposes a portion of the bit line 104. The first etch stop layer 108 may reduce the possibility of forming a bridge between adjacent contact holes by blocking the contact holes 110 from falling down.

A conductive material may be deposited on the first etch stop layer 108 so as to fill up the contact hole 110, forming a conductive layer. The conductive layer may be formed of tungsten (W). The conductive layer may be deposited by any method known in the art. According to a non-limiting example embodiment, the conductive layer may be deposited by a CVD process, a PECVD process, a physical vapor deposition (PVD) process, an atomic layer deposition (ALD) process, an electrochemical deposition (ECD) process, a metal organic CVD (MOCVD) process or a plasma-enhanced ALD (PEALD) process.

The conductive layer may be removed from the upper surface of the first etch stop layer 108 to form a contact plug 112 in the contact hole 110. The conductive layer may be removed by an etch-back process or a chemical mechanical polishing (CMP) process.

Figure 3B:
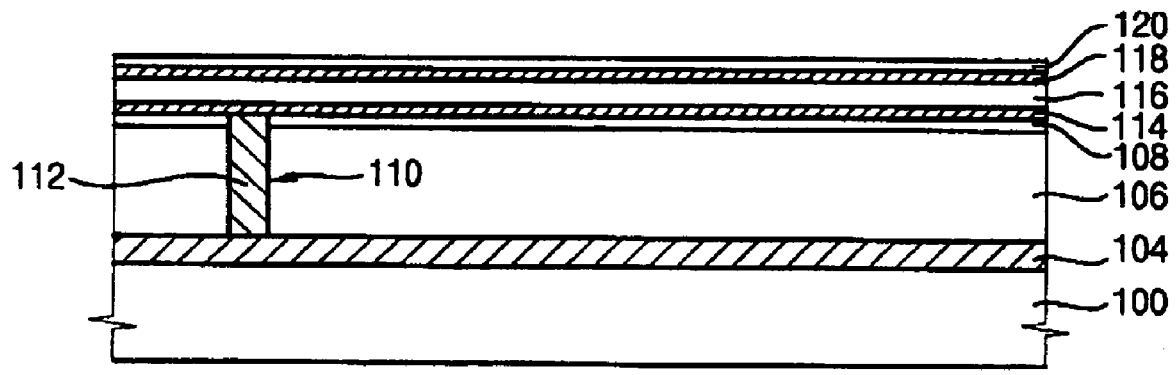

Referring to FIG. 3B, a first barrier layer 114, a first metal layer 116, a first capping layer 118 and/or a second etch stop layer 120 may be successively stacked on the contact plug 112 and the first etch stop layer 108. The first barrier layer 114 may be formed of titanium/titanium nitride (Ti/TiN). The first metal layer 116 may be formed of aluminum (Al). The first capping layer 118 may be formed of titanium/titanium nitride (Ti/TiN). The second etch stop layer 120 may be formed of silicon germanium (SiGe). Each of these stacked layers. may be deposited by any method known in the art such as CVD, PVD, ALD, ECD, MOCVD, PECVD or PEALD.

The second etch stop layer 120 may function as an etch stopper during an etching process of opening the fuse box region, reducing the possibility of over-etching the first metal layer 116 and breaking the fuses 122b. The second etch stop layer 120 may have a thickness of about 1,000 Å to about 3,000 Å.

Figure 3C:
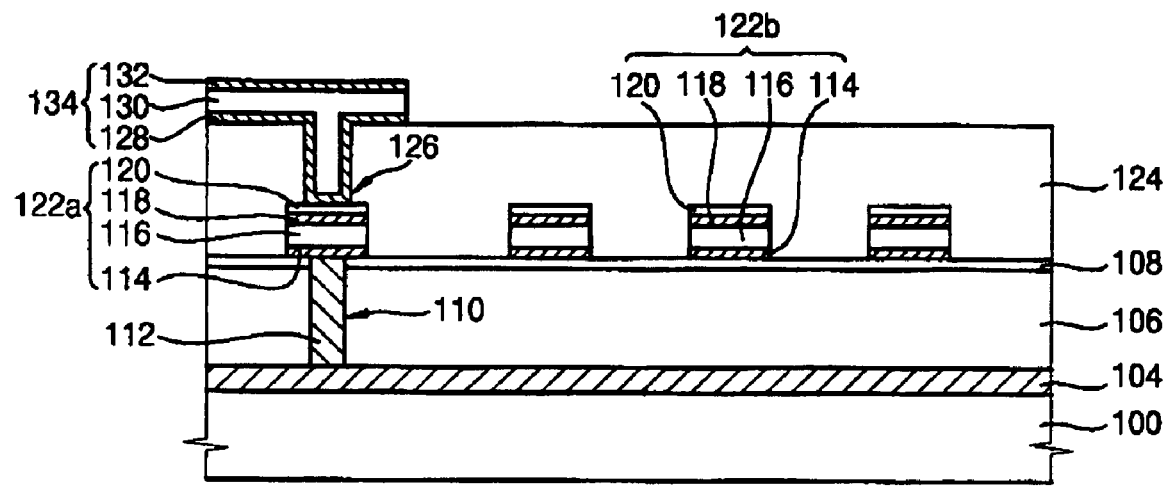

Referring to FIG. 3C, by performing a photolithography process, the second etch stop layer 120, the first capping layer 118, the first metal layer 116 and/or the first barrier layer 114 may be successively patterned to form a first metal wiring 122a and/or a plurality of fuses 122b.

The first metal wiring 122a may be electrically connected to the underlying bit line 104 through the contact plug 112.

Then, an insulating material may be deposited on the first metal wiring 122a, the fuses 122b and/or the first etch stop layer 108 to form a second insulation interlayer 124. The second insulation interlayer 124 may be formed of silicon oxide. The second insulation interlayer 124 may be formed by any suitable method known in the art, such as CVD, PECVD or HDP-CVD. The second insulation interlayer 124 may be partially etched by a photolithography process to form a via hole 126 that exposes a portion of the first metal wiring 122a.

A second barrier layer 128, a second metal layer 130 and/or a second capping layer 132 may be successively stacked on the via hole 126 and the second insulation interlayer 124. The second barrier layer 128 may be formed of Ti/TiN. The second metal layer 130 may be formed of aluminum. The second capping layer 132 may be formed of Ti/TiN. Each of these stacked layers may be deposited by any method known in the art, such as CVD, PVD, ALD, ECD, MOCVD, PECVD or PEALD. The stacked layers may be patterned by a photolithography process to form a second metal wiring 134 to be electrically connected with the first metal wiring 122a through the via hole 126.

Figure 3D:
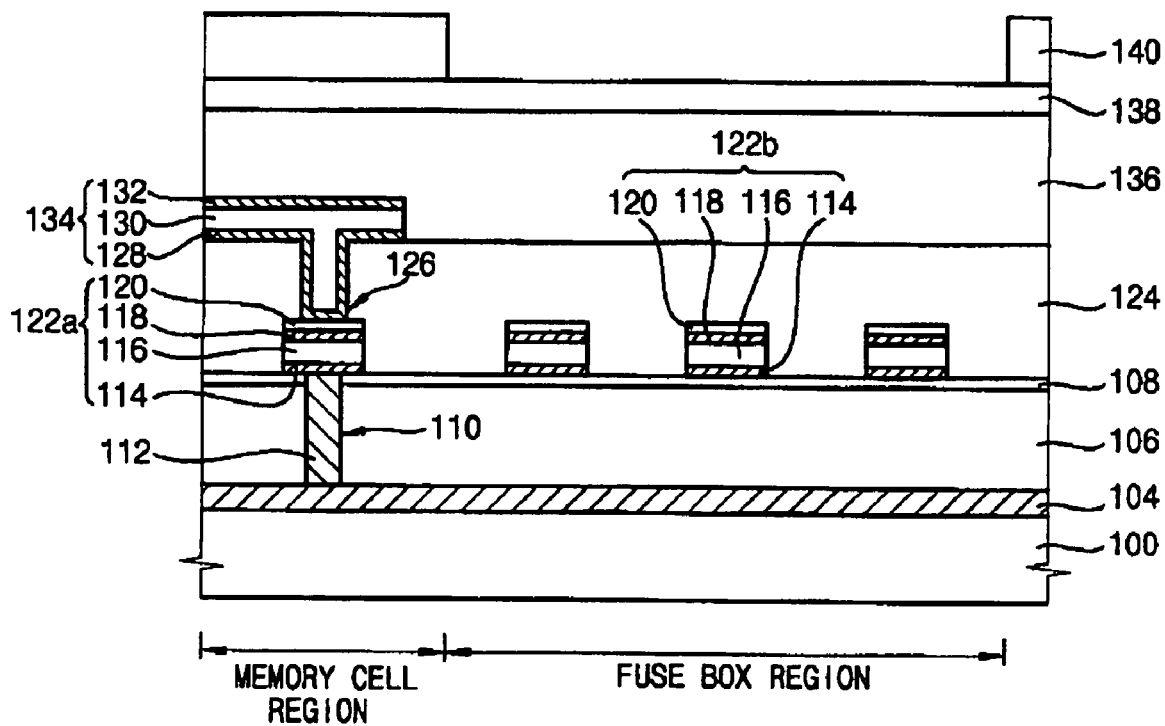

Referring to FIG. 3D, an insulating material may be deposited on the second metal wiring 134 and/or the second insulation interlayer 124 to form a third insulation interlayer 136. The third insulation interlayer 136 may be formed using silicon oxide. The third insulation interlayer 136 may be formed by any suitable method known in the art, such as CVD, PECVD or HDP-CVD. An insulating material may be deposited on the third insulation interlayer 136 to form a fourth insulation interlayer 138. The fourth insulation interlayer 138 may be formed of silicon nitride. The fourth insulation interlayer 138 may be formed by any suitable method known in the art, such as CVD, PECVD or HDP-CVD. During the etching process of opening the fuse box region, the fourth insulation interlayer 138 may function as a hard mask with respect to the second and/or third insulation interlayers 124 and 136, which may be formed of silicon oxide.

After coating a photoresist on the fourth insulation interlayer 138, the photoresist may be exposed and/or developed to form photoresist pattern 140 for defining the fuse box region.

Figure 3E:
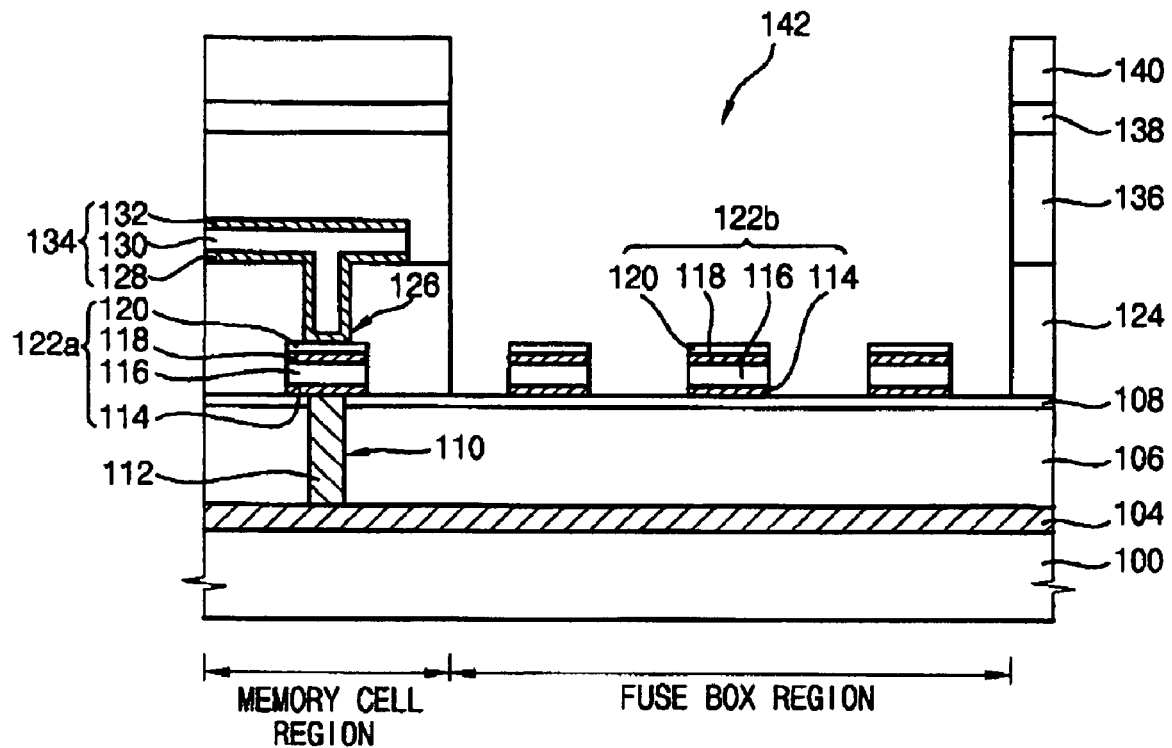

Referring to FIG. 3E, using the photoresist pattern 140 as an etching mask, the fourth insulation interlayer 138, the third insulation interlayer 136 and/or the second insulation interlayer 124 may be successively etched to form an opening 142 that exposes the fuse box region.

Due to the total thickness of the second and third insulation interlayers 124 and 136 (e.g., formed of silicon oxide at about 25,000 Å), the photoresist pattern 140 may not be a sufficient mask during the etching process for forming the opening 142. Accordingly, the third insulation interlayer 136 and/or second insulation interlayer 124 may be etched using the fourth insulation interlayer 138 as an etching mask. The fourth insulation interlayer 138 may be formed of silicon nitride having an etch selectivity to silicon oxide.

The insulation interlayers may be more uniformly etched to, or stopped on, the first etch stop layer 108 (e.g., formed of silicon nitride). The etching may be more precisely stopped on the first etch stop layer 108 even though the insulation interlayers may be over-etched, decreasing the likelihood of insufficient exposure of the fuses 122b due to under-etching of the insulation interlayers.

During the etching process of forming the opening 142, the second etch stop layer 120, protecting the first metal layer 116 for the fuses 122b, may retard the etching of the first metal layer 126.

Figure 3F:
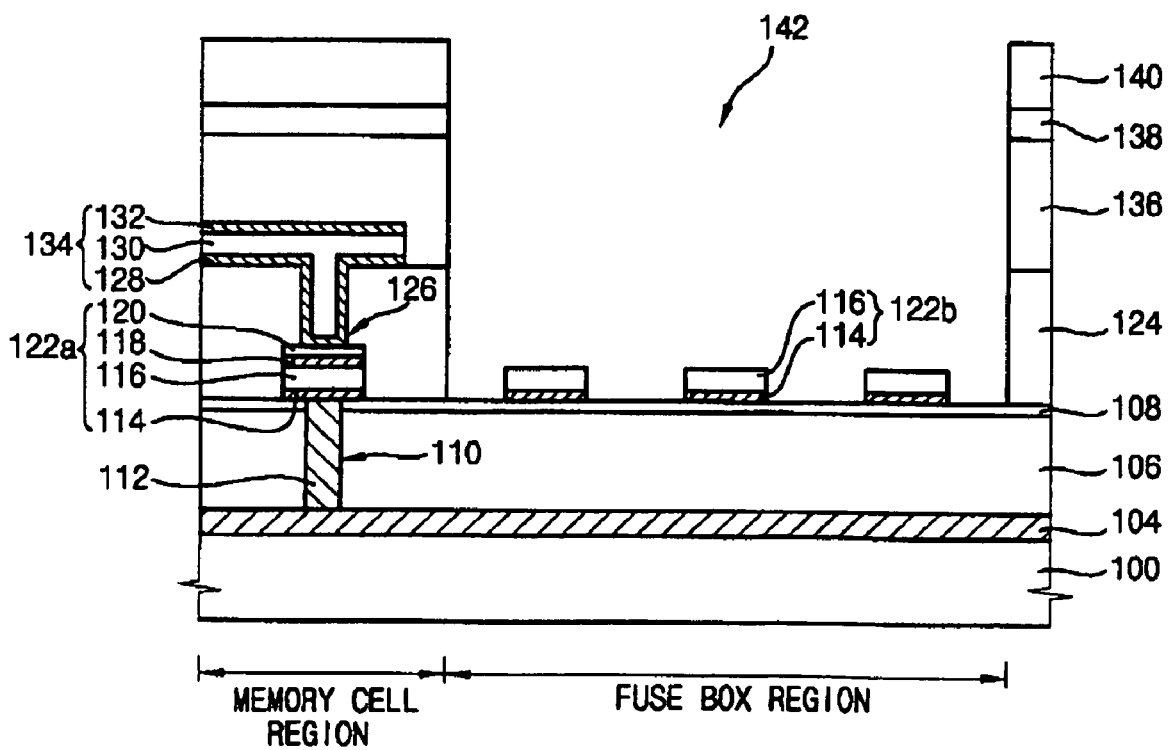

Referring to FIG. 3F, after etching the insulation interlayers to form the opening 142 and/or exposing the fuse box region as described above, the fuses 122b may be etched until the first metal layer 116 for the fuses 122b is at a thickness of about 2,000 Å. The fuse 122b may be etched to a predetermined thickness such that a cutting process for laser-repair may be performed more smoothly.

Due to more uniformly etching of the first metal layer 116 by the second etch stop layer 120 protecting the first metal layer 116 for the fuses 122b, the first metal layer 116 may remain at the more uniform thickness. The fuse 122b may include the first barrier layer 114 and/or the first metal layer 116.

As shown in FIG. 2, the photoresist patterns 140 may be removed by ashing and/or stripping processes. An insulating material may be continuously deposited to a thickness of about 1,000 Å to about 3,000 Å on the entire, or portion, of the resultant structure surface (e.g., on the fourth insulation interlayer 138, the first etch stop layer 108 and/or the fuses 122b) to form a passivation layer 144 for the exposed fuse 122b. The passivation layer 144 may be formed of silicon nitride. The passivation layer 144 may be formed by any suitable method known in the art, such as CVD, PECVD or HDP-CVD. The passivation layer 144 may retard damage to the adjacent fuses during the process of cutting a fuse connected to a defective memory cell by a laser beam.

Figure 4:
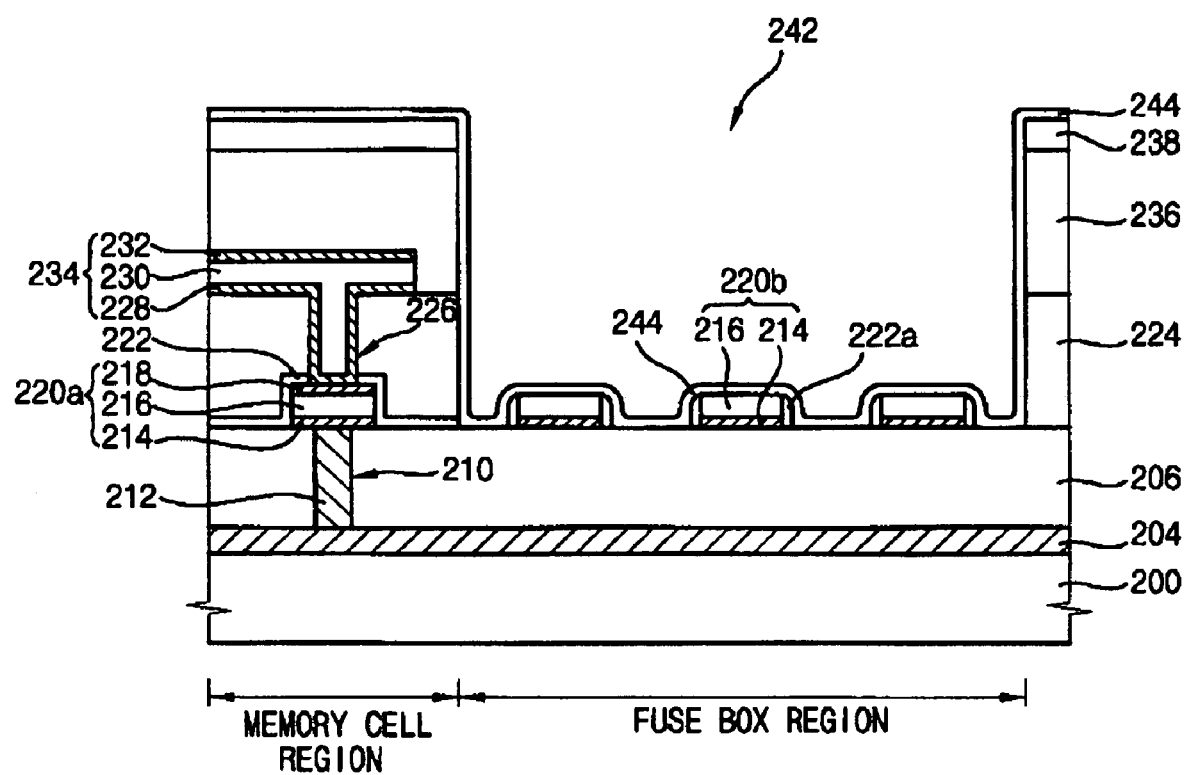

FIG. 4 is a cross-sectional view illustrating a semiconductor device in accordance with another example embodiment of the present invention.

Referring to FIG. 4, a bit line 204 may be formed on a semiconductor substrate 200 having a memory cell region and/or a fuse box region.

A first insulation interlayer 206 having a contact hole 210 that exposes a portion of the bit line 204 may be formed on the bit line 204 and/or the substrate 200. The first insulation interlayer 206 may be formed of silicon oxide.

A contact plug 212 may be formed in the contact hole 210. The contact plug 212 may be formed of a conductive material such as tungsten (W).

A first metal wiring 220a may be formed on the first insulation interlayer 206 of the memory cell region. The first metal wiring 220a may include a first barrier layer 214, a first metal layer 216 and/or a first capping layer 218, which may be successively stacked. Spaced apart from each other, a plurality of fuses 220b may be formed on the first insulation interlayer 206 of the fuse box region. Each of the fuses 220b may include the first barrier layer 214 and/or the first metal layer 216.

The first barrier layer 214 may retard a reaction between the first metal layer 216, which may be formed using aluminum (Al), and the contact plug 212, which may be formed using tungsten (W). The reaction of aluminum and tungsten may form undesirable by-products. The first barrier layer 214 may improve adhesion of the first metal layer 216 to the underlying first insulation interlayer 206 formed of silicon oxide. The first barrier layer 214 may be formed of titanium/titanium nitride (Ti/TiN).

The first capping layer 218 may retard oxidation of the first metal layer 216 and/or may protect the first metal layer 216. The first capping layer 218 may be formed of titanium/titanium nitride (Ti/TiN).

An etch stop layer 222 may be formed on the first metal wiring 220a and/or the first insulation interlayer 206 of the memory cell region. The etch stop layer 222 may be formed using any material which has an etch selectivity with respect to silicon dioxide (e.g., silicon nitride). Spacers 222a for etch stopping are formed on both sidewalls of each of the fuses 220b of the fuse box region. The spacers 222a may be formed of the same layer, or material, as the etch stop layer 222.

When etching the insulation interlayers formed of silicon oxide to form the fuse box region, the etch stop layer 222 and/and the spacers 222a for etch stopping may function as an etch stopper. The etching of the insulation interlayers may be more uniform.

A second insulation interlayer 224, having an opening 242 that exposes the fuse box region, may be formed on the first metal wiring 220a and/or the etch stop layer 222. The second insulation interlayer 224 may be formed of silicon oxide.

A second metal wiring 234 may be formed on the second insulation interlayer 224. The second metal wiring 234 may be electrically connected with the first metal wiring 220a through a via hole 226. The via hole may pass through the second insulation interlayer 224 to expose a portion of the underlying first metal wiring 220a.

The second metal wiring 234 may be formed by successively stacking a second barrier layer 228, a second metal layer 230 and/or a second capping layer 232. The second barrier layer 228 may be formed of Ti/TiN. The second metal layer 230 may be formed of aluminum (Al). The second capping layer 232 may be formed of Ti/TiN.

A third insulation interlayer 236 and/or a fourth insulation interlayer 238, each having the opening 242 exposing the fuse box region, may be formed on the second metal wiring 234 and/or the second insulation interlayer 224. The third insulation interlayer 236 may be formed of silicon oxide. The fourth insulation interlayer 238 may be formed of silicon nitride. The opening 242, which exposes the fuse box region, may be formed through the fourth insulation interlayer 238, the third insulation interlayer 236 and/or the second insulation interlayer 224.

A passivation layer 244 may be continuously formed on the fourth insulation interlayer 238 and/or a plurality of fuses 220b. The passivation layer 244 may be formed of silicon nitride. When cutting a fuse connected to a defective memory cell by a laser beam in a laser-repair step, the passivation layer 244 may decrease the possibility of damaging the adjacent fuses.

In the semiconductor device according to another example embodiment of the present invention, the etch stop layer 222 and/or the spacers 222a for etch stopping may function as an etch stopper during the etching of the insulation interlayers to open the fuse box region. The insulation interlayers may be more uniformly etched to the etch stop layer 222 in order that the fuses 220b may be more uniformly formed.

Although the insulation interlayers may be over-etched to ensure the fuses 220b open, the etching process may be stopped more precisely on the etch stop layer 108 to reduce the chances of breaking the fuses 220b.

FIGS. 5A to 5D are cross-sectional views illustrating a method of manufacturing a semiconductor device shown in FIG. 4.

Figure 5A:
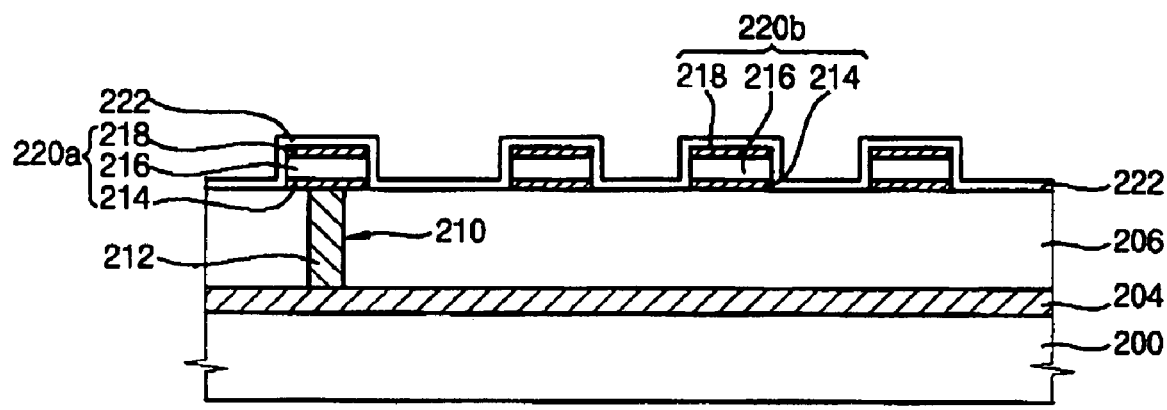
FIGS. 5A to 5D are cross-sectional views illustrating a method of forming a fuse of a semiconductor device in accordance with example embodiments of the present invention.

Referring to FIG. 5A, a bit line 204, a first insulation interlayer 206, a contact hole 210 and/or a contact plug 212 may be formed on a semiconductor substrate 200. A first barrier layer 214, a first metal layer 216 and/or a first capping layer 218 may be successively stacked on the contact plug 212 and/or the first insulation interlayer 206. The first barrier layer 214 may be formed of titanium/titanium nitride (Ti/TiN). The first metal layer 216 may be formed of aluminum (Al). The first capping layer 218 may be formed of titanium/titanium nitride (Ti/TiN). Each of these stacked layers may be deposited by any method known in the art, such as CVD, PVD, ALD, ECD, MOCVD, PECVD or PEALD.

By performing a photolithography process, the first capping layer 218, the first metal layer 216 and/or the first barrier layer 214 may be successively patterned to form a first metal wiring 220a and/or a plurality of fuses 220b. The first metal wiring 220a may be electrically connected to the underlying bit line 204 through the contact plug 212.

Figure 5B:
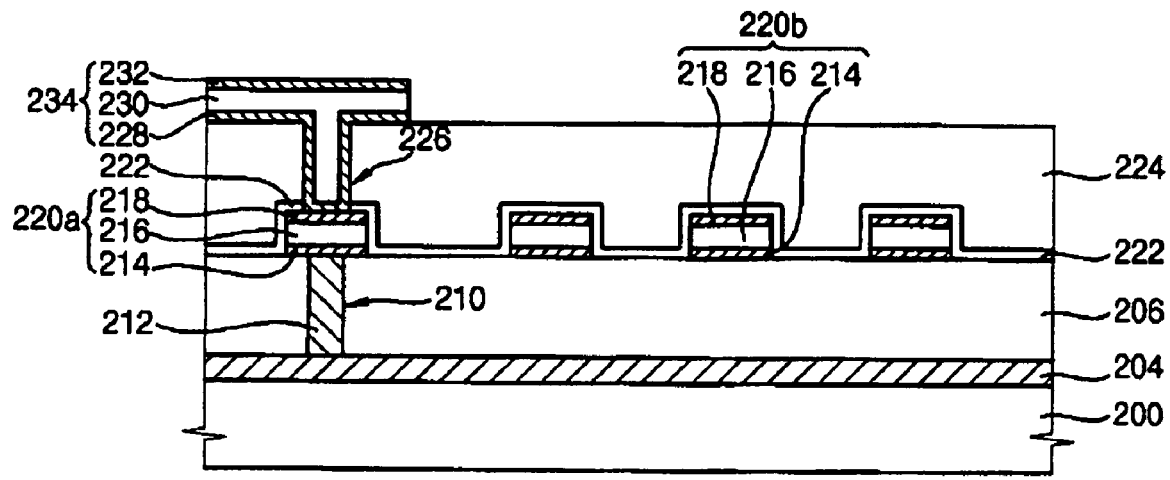

Referring to FIG. 5B, after forming the first metal wiring 220a and/or a plurality of fuses 220b, an insulating material may be deposited on the first metal wiring 220a, the fuses 220b and/or the first insulation interlayer 206 to form an etch stop layer 222. The etch stop layer 222 may be formed of any material that has an etch selectivity with respect to silicon oxide (e.g., silicon nitride). The etch stop layer 222 may have a thickness of about 1,000 Å to about 4,000 Å. The etch stop layer 222 may be formed by any suitable method known in the art, such as CVD, PECVD or HDP-CVD.

The etch stop layer 222 may serve as an etch stopper during a etching process of opening the fuse box region.

An insulating material may be deposited on the etch stop layer 222 to form a second insulation interlayer 224. The second insulation interlayer 224 may be formed of silicon oxide. The second insulation interlayer 224 may be formed by any suitable method known in the art, such as CVD, PECVD or HDP-CVD. The second insulation interlayer 224 may be partially etched by a photolithography process to form a via hole 226 that exposes a portion of the first metal wiring 220a. Due to the formation of the etch stop layer 222 (e.g., formed of silicon nitride) on the first metal wiring 220a, the etching process of forming the via hole 226 may be performed up to the etch stop layer 222. The etch stop layer 222, formed on the first metal wiring 220a, may be substantially removed in order to electrically connect the first metal wiring 220a with a second metal wiring.

A second barrier layer 228, a second metal layer 230 and/or a second capping layer 232 may be successively stacked on the second insulation interlayer 224 to fill up the via hole 226. The second barrier layer 228 may be formed of Ti/FiN. The second metal layer 230 may be formed of aluminum (Al). The second capping layer 232 may be formed of Ti/TiN. Each of these stacked layers may be deposited by any method known in the art, such as CVD, PVD, ALD, ECD, MOCVD, PECVD or PEALD.

Figure 5C:
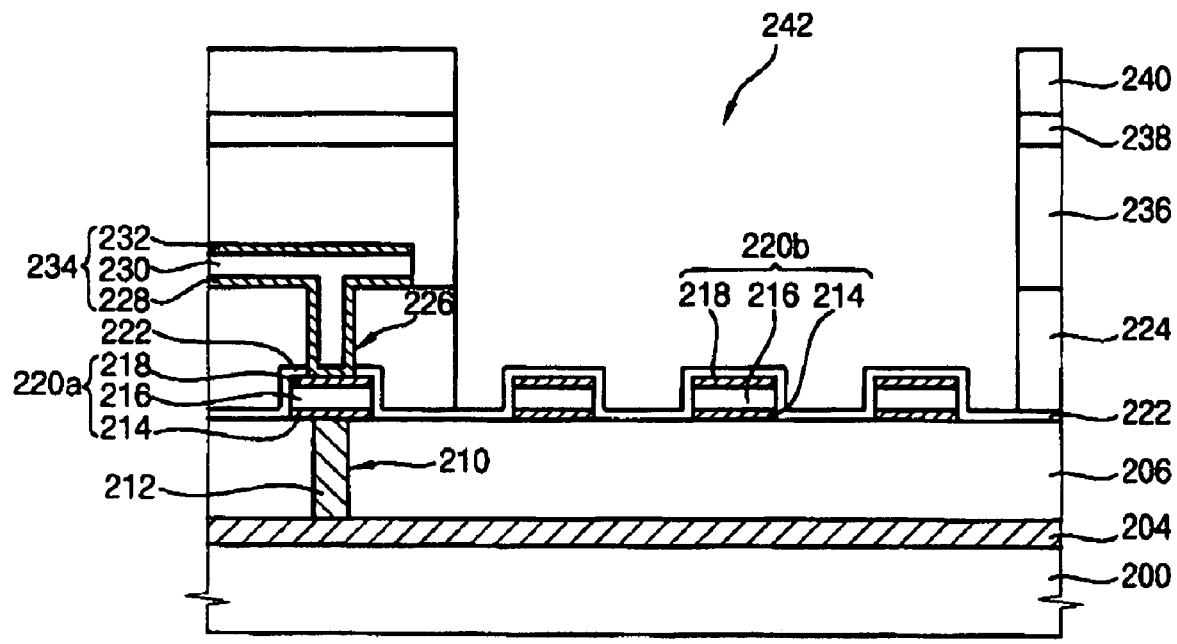

The stacked layers may be patterned by a photolithography process to form a second metal wiring 234. The second metal wiring 234 may be electrically connected with the first metal wiring 220a through the via hole 226. Referring to FIG. 5C, an insulating material may be deposited on the second metal wiring 234 and/or the second insulation interlayer 224 to form a third insulation interlayer 236. The third insulation interlayer 236 may be formed of silicon oxide. The third insulation interlayer 236 may be formed by any suitable method known in the art, such as CVD, PECVD or HDP-CVD. An insulating material may be deposited on the third insulation interlayer 236 to form a fourth insulation interlayer 238. The fourth insulation interlayer 238 may be formed of silicon nitride. The fourth insulation interlayer 238 may be formed by any suitable method known in the art, such as CVD, PECVD or HDP-CVD. During an etching process of opening the fuse box region, the fourth insulation interlayer 238 may function as a hard mask with respect to the second and/or third insulation interlayers 224 and 236, which may include silicon oxide.

After coating a photoresist on the fourth insulation interlayer 238, the photoresist may be exposed and/or developed to form photoresist patterns 240 for defining the fuse box region.

Using the photoresist patterns 240 as an etching mask, the fourth insulation interlayer 238, the third insulation interlayer 236 and/or the second insulation interlayer 224 may be successively etched to form an opening 242 that may expose the fuse box region.

The insulation interlayers may be etched to, or stopped more precisely on, the etch stop layer 222. The etching may be stopped on the etch stop layer 222 although the insulation interlayers may be over-etched, decreasing the possibility of under-exposing the fuse 220b due to the insufficient etching of the insulation interlayers.

Figure 5D:
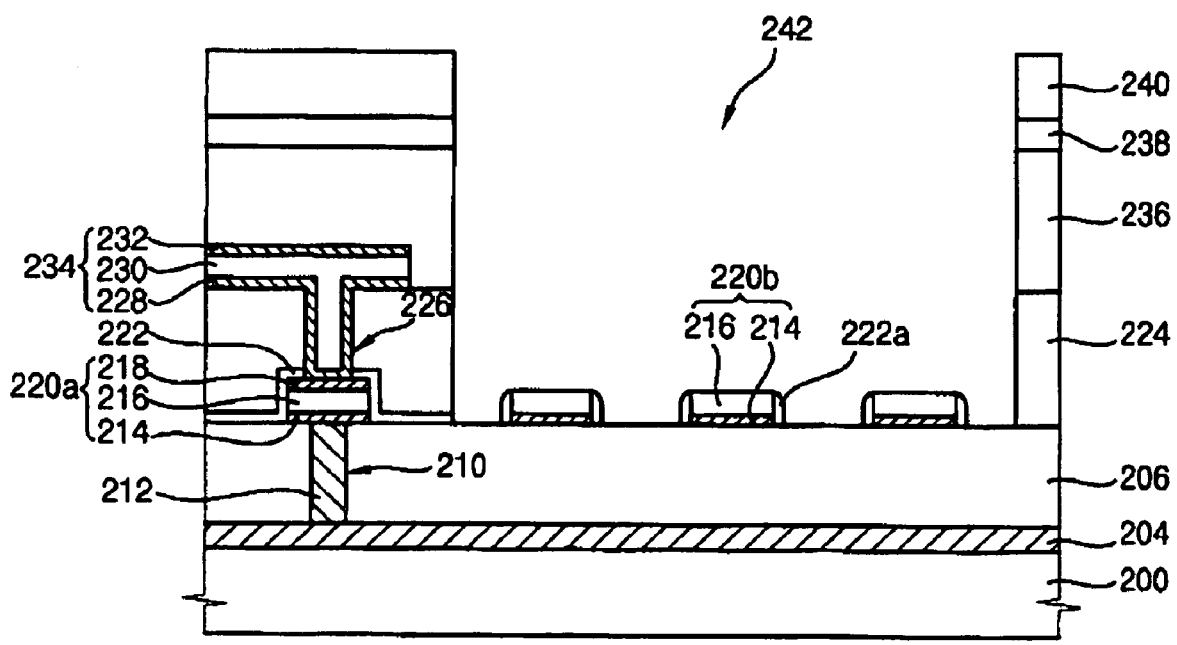

Referring to FIG. 5D, the fuses 220b may be etched until the first metal layer 216 for the fuse 222b remains at a thickness of about 2,000 Å. The fuse 220b may be etched to a predetermined thickness in order that a cutting process for laser-repair may be more smoothly performed.

Accordingly, each of the fuses 220b may include the first barrier layer 214 and/or the first metal layer 216.

According to an example embodiment of the present invention, if the etch rate of the first metal layer 216 for the fuse 220b is similar to the etch rate the etch stop layer 222, the etch stop layer 222 of the fuse box region and the first metal layer 216 may be simultaneously removed during etching of the fuses 220b. As a result, spacers 222a for etch stopping may be formed on sidewalls of each fuse 220b. The spacers 222a may be formed of the same material, or layer, as the etch stop layer 222.

As shown in FIG. 4, the photoresist patterns 240 may be removed by ashing and/or stripping processes. An insulating material may be repeatedly deposited to a thickness of about 1,000 Å to about 3,000 Å on the surface of the resultant structure (e.g., on the fourth insulation interlayer 238, the first insulation interlayer 206, the spacers for etch stopping 222a and/or the fuses 122b) to form a passivation layer 244 for the exposed fuse 220b.

The passivation layer 244 may be formed of silicon nitride. The passivation layer 244 may be formed by any suitable method known in the art, such as CVD, PECVD or HDP-CVD. The passivation layer 244 may reduce the possibility of damaging the adjacent fuses during a laser-repair step of cutting a fuse connected to a defective memory cell by a laser beam.

According to example embodiments of the present invention, the process of etching the insulation interlayers to open the fuse box region may be performed on a semiconductor device with an etch stop layer having an etch selectivity with respect to the insulation interlayers.

Accordingly, the insulation interlayers may be more uniformly etched to the etch stop layer such that the fuses may be formed more uniformly. Although the insulation interlayers may be over-etched to ensure the fuses open, the etching process may be stopped more precisely on the etch stop layer to reduce the probability of breaking the fuses. Although some example embodiments of the present invention have been described, it is understood that the present invention should not be limited to these embodiments but various changes and modifications can be made by one skilled in the art within the spirit and scope of the present invention as hereinafter claimed.

What is claimed is:

1. A method of manufacturing a semiconductor device, comprising:
    forming a first insulation interlayer on a semiconductor substrate;
    forming a first etch stop layer on the first insulation interlayer;
    successively stacking a barrier layer, a metal layer and a capping layer on the first etch stop layer;
    forming a second etch stop layer on the capping layer to reduce the metal layer from being exposed during an etching process;
    patterning the stacked layers to form a metal wiring on the first etch stop layer and a plurality of fuses on the first etch stop layer;
    forming a second insulation interlayer on the metal wiring, the plurality of fuses and the first etch stop layer; and
    etching the second insulation interlayer to form an opening exposing a fuse box region.

2. The method of claim 1, further comprising etching the plurality of fuses until a portion of the metal layer is exposed, after forming the opening.

3. The method of claim 1, wherein the forming the plurality of fuses includes spacing the fuses apart from each other.

4. The method of claim 1, wherein the semiconductor substrate includes a memory cell region and a fuse box region such that the memory cell region includes the metal wiring and the fuse box region includes the plurality of fuses.

5. The method of claim 1, further comprising forming a passivation layer continuously on the second insulation interlayer, the first etch stop layer and the plurality of fuses in order to reduce damage to adjacent fuses.

6. The method of claim 5, wherein the passivation layer is formed of silicon nitride, the second etch stop layer is formed of silicon germanium (SiGe) and the first etch stop layer is formed of silicon nitride.

7. A method of manufacturing a semiconductor device, comprising:
    forming a first insulation interlayer on a semiconductor substrate;
    successively stacking a barrier layer, a metal layer and a capping layer on the first insulation interlayer;
    patterning the stacked layers to form a metal wiring on the first insulation interlayer and to form a plurality of fuses on the first insulation interlayer;
    forming an etch stop layer continuously on the first insulation interlayer, the metal wiring and the plurality of fuses to reduce the metal layer from being exposed during an etching process;
    forming a second insulation interlayer on the metal wiring, the plurality of fuses and the etch stop layer; and
    etching the second insulation interlayer to form an opening exposing the fuse box region.

8. The method of claim 7, further comprising simultaneously etching the plurality of fuses to expose the metal layer and forming spacers on both sidewalls of each of the fuses after forming the opening, wherein the spacers and the etch stop layer are formed of a same layer.

9. The method of claim 7, wherein the semiconductor substrate includes a cell region and a fuse box region such that the cell region includes the metal wiring and the fuse box region includes the plurality of fuses.

10. The method of claim 8, wherein an etch rate of the plurality of fuses is similar an etch rate of the etch stop layer.

* * * * *